(12) United States Patent
Lee

(10) Patent No.: US 9,831,451 B2
(45) Date of Patent: Nov. 28, 2017

(54) THIN FILM TRANSISTOR ARRAY SUBSTRATE AND MANUFACTURING METHOD OF THE SAME

(71) Applicant: SAMSUNG DISPLAY CO., LTD, Yongin, Gyeonggi-Do (KR)

(72) Inventor: Je-Hun Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/956,058

(22) Filed: Dec. 1, 2015

(65) Prior Publication Data

US 2016/0197295 A1    Jul. 7, 2016

(30) Foreign Application Priority Data

Jan. 7, 2015   (KR) .................. 10-2015-0002156

(51) Int. Cl.
| | | |
|---|---|---|
| *H01L 27/14* | (2006.01) | |
| *H01L 29/04* | (2006.01) | |
| *H01L 29/15* | (2006.01) | |
| *H01L 31/036* | (2006.01) | |
| *H01L 51/05* | (2006.01) | |
| *H01L 27/12* | (2006.01) | |

(Continued)

(52) U.S. Cl.
CPC ...... *H01L 51/0512* (2013.01); *H01L 27/1248* (2013.01); *H01L 27/1259* (2013.01); *H01L 29/41733* (2013.01); *H01L 29/42384* (2013.01); *H01L 29/4908* (2013.01); *H01L 29/66742* (2013.01); *H01L 29/786* (2013.01); *H01L 51/107* (2013.01)

(58) Field of Classification Search
CPC ........... H01L 27/1225; H01L 29/66969; H01L 29/78606; H01L 27/3262; H01L 29/786; H01L 21/02178; H01L 21/76877; H01L 2251/303; H01L 29/7869; H01L 29/78618
USPC ................ 257/43, 59, 57, 66, 72, 288, 344; 438/104, 688, 158
See application file for complete search history.

(56) References Cited

U.S. PATENT DOCUMENTS

| | | | |
|---|---|---|---|
| 6,432,820 B1 * | 8/2002 | Lee .................. | H01L 21/28562 257/E21.171 |
| 2001/0019125 A1 * | 9/2001 | Hong .................... | G02F 1/1362 257/59 |

(Continued)

FOREIGN PATENT DOCUMENTS

| | | |
|---|---|---|
| JP | 2011-082380 A | 4/2011 |
| KR | 10-2010-0040677 A | 4/2010 |
| KR | 10-1146486 B1 | 5/2012 |

*Primary Examiner* — Lex Malsawma
*Assistant Examiner* — Nduka Ojeh
(74) *Attorney, Agent, or Firm* — H.C. Park & Associates, PLC

(57) ABSTRACT

Provided is a thin film transistor array substrate, including a gate electrode, a gate insulating layer covering the gate electrode, a semiconductor pattern formed on the gate insulating layer and including a channel region overlapping the gate electrode, a source electrode and a drain electrode formed on the semiconductor pattern and facing each other with a first opening exposing the channel region therebetween, a first protective layer formed on the gate insulating layer to cover the source electrode, the drain electrode and the semiconductor pattern and a metal oxide layer formed along a surface of the first protective layer.

18 Claims, 5 Drawing Sheets

(51) Int. Cl.
*H01L 29/786* (2006.01)
*H01L 29/66* (2006.01)
*H01L 29/49* (2006.01)
*H01L 29/423* (2006.01)
*H01L 29/417* (2006.01)
*H01L 51/10* (2006.01)

(56) References Cited

U.S. PATENT DOCUMENTS

| | | | |
|---|---|---|---|
| 2004/0241980 A1* | 12/2004 | Yamazaki | G02F 1/136227 |
| | | | 438/632 |
| 2008/0185588 A1* | 8/2008 | Park | H01L 29/78603 |
| | | | 257/59 |
| 2010/0090217 A1 | 4/2010 | Akimoto | |
| 2011/0180802 A1* | 7/2011 | Morosawa | H01L 29/7869 |
| | | | 257/59 |
| 2013/0048977 A1* | 2/2013 | Watanabe | H01L 29/78606 |
| | | | 257/43 |

* cited by examiner

THIN FILM TRANSISTOR ARRAY SUBSTRATE AND MANUFACTURING METHOD OF THE SAME

CLAIM OF PRIORITY

This application claims the priority to and all the benefits accruing under 35 U.S.C. §119 of Korean Patent Application No. 10-2015-0002156, filed on Jan. 7, 2015, in the Korean Intellectual Property Office (KIPO), the entire content of which is incorporated herein by reference in its entirety.

BACKGROUND OF THE INVENTION

Field of Disclosure

Embodiments relate to a thin film transistor array substrate and a manufacturing method of the same.

Description of the Related Art

Among display devices, flat panel display devices are popular because weight can be reduced and thin film can be used. A flat panel display device includes various display devices such as a liquid crystal display device, an organic light emitting display device and the like. The flat panel display device may include pixels arranged in matrix form. The flat panel display device may include a thin film transistor array substrate having various devices for driving pixel.

The thin film transistor array substrate may include gate lines transmitting gate signals, data lines transmitting data signals and thin film transistors coupled to the gate lines and the data lines. Each of the thin film transistors may include a gate electrode extending from the corresponding gate line, a source electrode extending from the corresponding data line, a drain electrode facing the source electrode, and a semiconductor layer acting as a channel and may be used as a switching device.

The above-described thin film transistor array substrate may include patterns made of various thin films and a protective layer protecting the patterns. In a process of covering the patterns of the thin film transistor array substrate with the protective layer, a void or a seam may occur in the protective layer. The void or seam in the protective layer may reduce image quality by causing various process defects.

SUMMARY OF THE INVENTION

Embodiments may be realized by providing a thin film transistor array substrate, including a gate electrode, a gate insulating layer covering the gate electrode, a semiconductor pattern formed on the gate insulating layer and including a channel region overlapping the gate electrode, a source electrode and a drain electrode formed on the semiconductor pattern and facing each other with a first opening exposing the channel region therebetween, a first protective layer formed on the gate insulating layer to cover the source electrode, the drain electrode and the semiconductor pattern and a metal oxide layer formed along a surface of the first protective layer.

The source electrode and the drain electrode each, being oxidized, may include sidewall protruding convexly.

The first protective layer may include a groove formed along an edge of the first opening.

The groove may have an angle between adjacent contacting inner sides of the groove being greater than 0° and less than 106°.

The metal oxide layer may be formed to fill the groove.

The first protective layer may include a silicon oxide layer.

The source electrode and the drain electrode may include copper.

The metal oxide layer may include an aluminum oxide layer.

The thin film transistor array substrate may further include a second protective layer formed on the metal oxide layer, an organic layer formed on the second protective layer, a second opening exposing the drain electrode by passing through the organic layer, the second protective layer, the metal oxide layer and the first protective layer and a pixel electrode formed on the organic layer to contact the drain electrode via the second opening.

In an embodiment, there may be provided a method for manufacturing a thin film transistor array substrate, the method including forming a thin film transistor including a gate electrode, a semiconductor pattern disposed on the gate electrode with a gate insulating layer therebetween and a source electrode and a drain electrode disposed on the semiconductor pattern and facing each other with a first opening exposing a portion of the semiconductor pattern therebetween, forming a first protective layer covering the thin film transistor and forming a metal oxide layer along a surface of the first protective layer.

During the forming of the first protective layer, sidewall of each of the source electrode and the drain electrode, being oxidized, may protrude convexly.

During the forming of the first protective layer, a groove may be formed along an edge of the first opening.

The groove may have an angle between adjacent contacting inner sides of the groove greater than 0° and less than 106°.

The forming of the metal oxide layer may include forming a metal layer along a surface of the first protective layer including the groove and performing thermal processing such that the metal layer is oxidized while being reflown and filling the groove.

During the performing of the thermal processing, oxygen may be injected.

The metal layer may include aluminum.

The forming of the first protective layer may include forming a silicon oxide layer.

The source electrode and the drain electrode may include copper.

The forming of the metal oxide layer may include forming an aluminum oxide layer.

The method may further include forming a second protective layer on the metal oxide layer, forming an organic layer on the second protective layer, forming a second opening exposing the drain electrode by etching the organic layer, the second protective layer, the metal oxide layer and the first protective layer and forming a pixel electrode coupled to the drain electrode via the second opening on the organic layer.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings, in which like reference symbols indicate the same or similar components, wherein.

DETAILED DESCRIPTION OF THE INVENTION

Figure 1A:
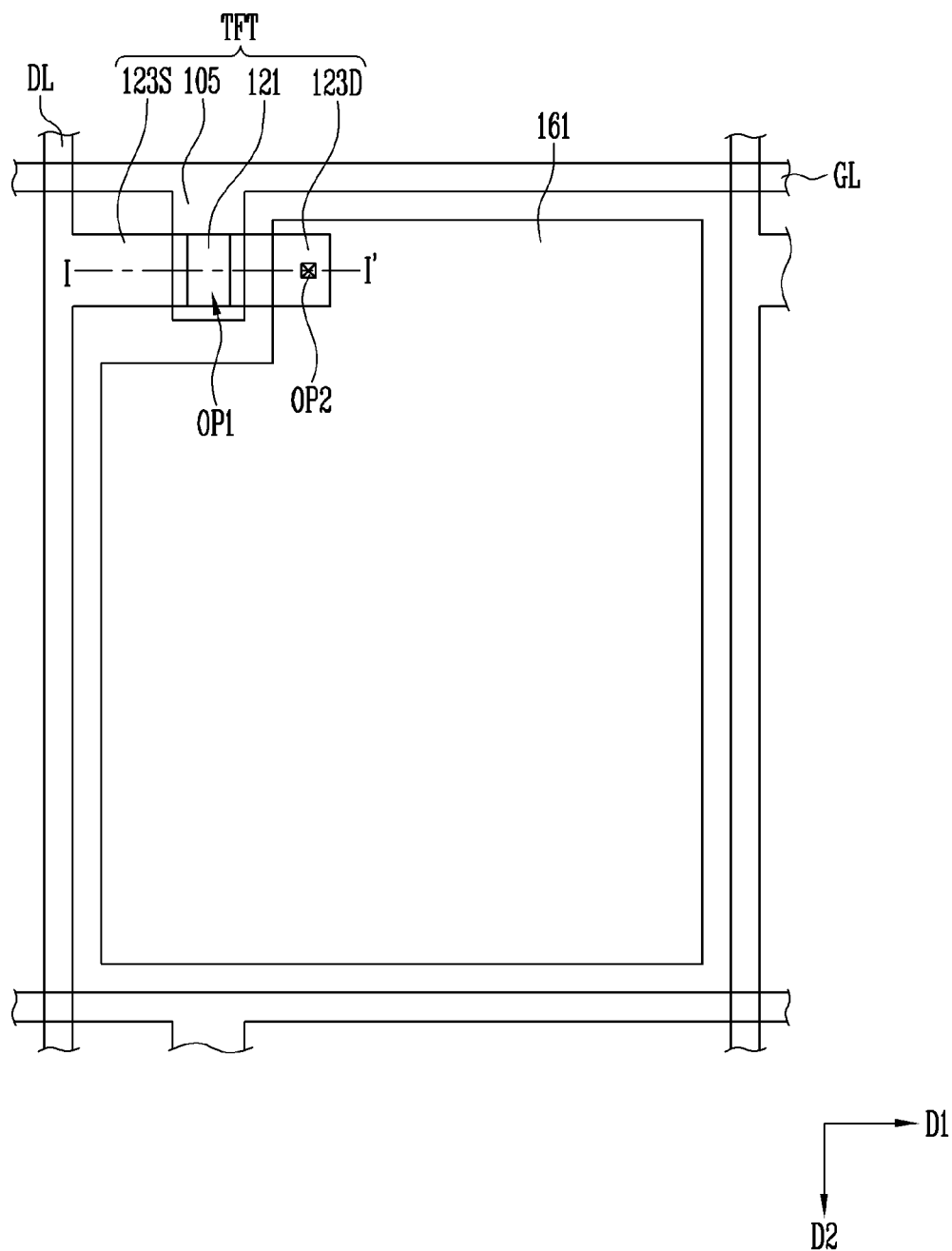
FIG. 1A is a plan view illustrating a thin film transistor array substrate according to an embodiment.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. In addition, it will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1B:
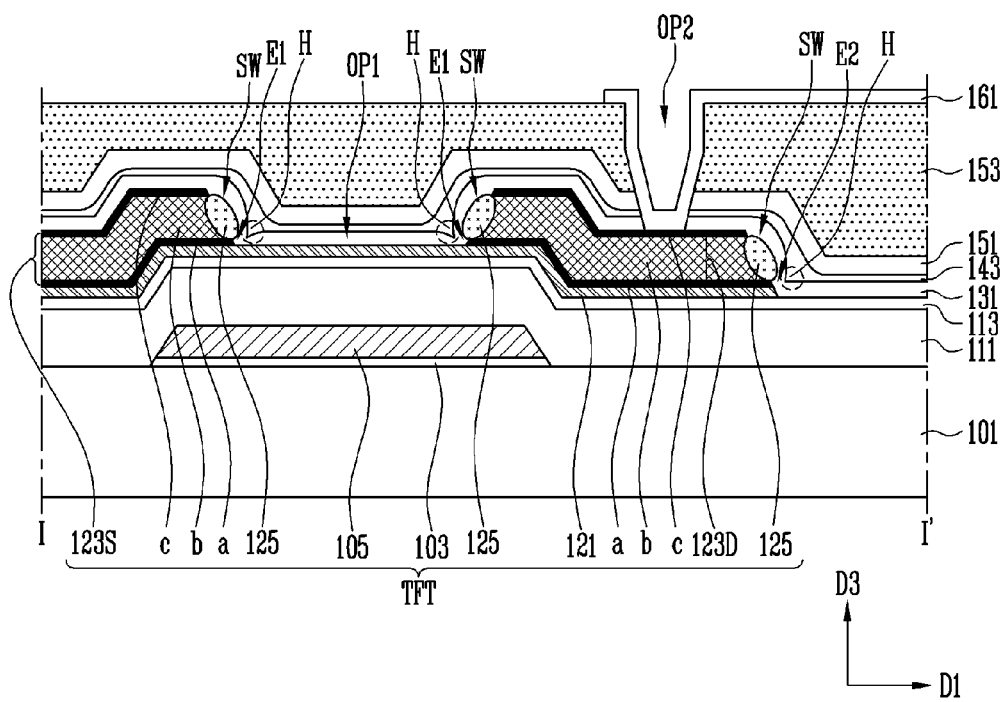
FIG. 1B is a cross-sectional view taken along a line I-I' of FIG. 1A.

FIG. 1A is a plan view illustrating a thin film transistor array substrate according to an embodiment. FIG. 1B is a cross-sectional view taken along a line I-I' of FIG. 1A.

Referring to FIGS. 1A and 1B, a thin film transistor array substrate may include a thin film transistor TFT formed on a substrate 101 and a pixel electrode 161 coupled to the thin film transistor TFT. The thin film transistor TFT may include a gate electrode 105, a semiconductor pattern 121, a source electrode 123S and a drain electrode 123D. The thin film transistor TFT may be coupled to a pixel electrode of a liquid crystal display device or a pixel electrode of an organic light emitting display device. Although a thin film transistor TFT of a bottom gate type is illustrated as an example below, thin film transistor form according to an embodiment may be changed into various structures such as the top gate type (not shown).

The substrate 101 may be an insulating substrate. The substrate 101 may be formed of a material such as transparent glass or plastic and the like.

The gate electrode 105 may be formed on the substrate 101 with a buffer layer 103 therebetween. The buffer layer 103 may be formed of a silicon oxide layer, a silicon nitride layer and the like. Depending on circumstances, the buffer layer 103 may not even be formed.

The gate electrode 105 may extend from a gate line (GL) that applies ON/OFF signals of the thin film transistor TFT. The gate line may extend in a first direction D1. The gate electrode 105 may be formed of various metals such as aluminum, copper, silver, molybdenum, chrome, tungsten and the like. The gate electrode 105 may be formed of a single layer including any one of the above-described metals or of a single layer made of an alloy of the above-described metals. The gate electrode 105 may be formed of at least a double layer.

The semiconductor pattern 121 may be disposed on the gate electrode 105. An insulating layer of a single stack structure or a multi stack structure may be disposed between the semiconductor pattern 121 and the gate electrode 105. For example, but without limitation thereto, gate insulating layers 111 and 113 may be disposed between the semiconductor pattern 121 and the gate electrode 105. The gate insulating layers 111 and 113 may include a first gate insulating layer 111 formed of a silicon nitride layer and a second gate insulating layer 113 formed of a silicon oxide layer stacked on the first gate insulating layer 111. The gate insulating layers 111 and 113 may be formed on the substrate 101 to cover the gate electrode 105.

The semiconductor pattern 121 may be disposed on the gate insulating layers 111 and 113. The semiconductor pattern 121 may include a channel region, a source region and a drain region. The channel region may overlap the gate electrode 105. The source region and the drain region may face each other with the channel region therebetween. The semiconductor pattern 121 may be formed of silicon, an oxide semiconductor such as IGZO, or an organic semiconductor.

The source electrode 123S and the drain electrode 123D may be formed on the semiconductor pattern 121 and may face each other and spaced apart from each other by a first opening OP1 exposing the channel region of the semiconductor pattern 121 therebetween. The source electrode 123S may be disposed on the source region of the semiconductor pattern 121, and the drain electrode 123D may be disposed on the drain region of the semiconductor pattern 121. The source electrode 123S may extend from a data line (DL). The data line may extend in a second direction D2, which crosses the first direction D1. D3 in FIG. 1B is a direction perpendicular to both the first and second directions. When the thin film transistor TFT is turned on, the source electrode 123S may supply a data voltage supplied from the data line DL to the drain electrode 123D. The source electrode 123S and the drain electrode 123D may be formed of a same conductive material on a same plane. The source electrode 123S and the drain electrode 123D may be formed of various metal materials. Each of the source electrode 123S and the drain electrode 123D may be a stacked structure of a first barrier metal layer a, a metal layer b and a second barrier metal layer c. The metal layer b may be formed of copper Cu for reducing resistance.

The source electrode 123S, the drain electrode 123D and the semiconductor pattern 121 may be protected by the first protective layer 131. The first protective layer 131 may be formed on the gate insulating layers 111 to cover the source electrode 123S, the drain electrode 123D and the semiconductor pattern 121. The first protective layer 131 may be formed of a silicon oxide layer. Sidewall of the metal layer b of the source electrode 123S and the drain electrode 123D may be oxidized and go through volume expansion in a process of forming the first protective layer 131. As a result, sidewall SW of each of the source electrode 123S and the drain electrode 123D may be oxidized and protrude convexly. The convexly protruding sidewall SW of each of the source electrode 123S and the drain electrode 123D may be due to metal oxide region 125 formed as the metal layer b is oxidized.

Due to the convexly protruding sidewall SW of the source electrode 123S and the drain electrode 123D, a groove H may be formed at a portion of the first protective layer 131. The groove H may be formed along an edge E1 of one side of the source electrode 123S or the drain electrode 123D where a first opening OP1 is provided. The groove H may be formed along an edge E2 of the other side of the source electrode 123S or the drain electrode 123D where an edge of the semiconductor pattern 121 is provided in a plan view.

The metal oxide layer 143 may be formed on the first protective layer 131 along a surface of the first protective layer 131. The metal oxide layer 143 may be formed by oxidizing the metal layer. When the metal layer is oxidized, the metal layer may melt by applying heat to the metal layer. In the process of forming the metal oxide layer 143, in order to reduce thermal stress that is applied to the thin film transistor TFT, a metal layer for metal oxide layer 143 may be formed of a material having a low melting point. For example but without limitation thereto, an aluminum layer and an aluminum alloy layer that includes aluminum may be used as the metal layer for the metal oxide layer 143. In this case, the metal oxide layer 143 may be formed of aluminum oxide layer. In the process of forming the metal oxide layer 143, the metal layer may have liquidity as the metal layer is melted by heat. As the metal layer that has liquidity is reflown to the groove H to form a non-uniform cross-sectional shape (in e.g. FIGS. 1A, 1B, and 2C to 2G), and the flowing metal layer may fill the groove H and be oxidized. As a result, the groove H may be filled with the metal oxide layer 143.

The second protective layer 151 and the organic layer 153 may be sequentially stacked on the metal oxide layer 143. The second protective layer 151 may be formed of a silicon nitride layer.

If the second protective layer 151 and the organic layer 153 are sequentially stacked on the first protective layer 131 without filling the groove H with the metal oxide layer 143, a void or a seam may occur at the groove H. If the groove H is formed with an angle greater than 0° and less than 106°, there may be a great likelihood that the void or seam may occur. In an embodiment, after the groove H having an angle that is greater than 0° and less than 106° is filled with the metal oxide layer 143, the second protective layer 151 and the organic layer 153 may be formed on the metal oxide layer 143. As a result, the void or seam may be avoided.

The organic layer 153, the second protective layer 151, the metal oxide layer 143, and the first protective layer 131 may be etched to form the second opening OP2. The second opening OP2 may expose the drain electrode 123D.

The pixel electrode 161 may be formed on the organic layer 153 to contact the drain electrode 123D exposed through the second opening OP2. The pixel electrode 161 may be formed of various conductive materials such as transparent conductive layer.

A threshold voltage of the thin film transistor TFT may be stabilized through a double protective layer structure of the first protective layer 113 formed of silicon oxide layer and the second protective layer 151 formed of silicon nitride layer. The embodiment may be applied to a multi protective layer structure of at least triple layers, besides the double protective layer structure of the first and second protective layers 113 and 151.

FIGS. 2A to 2G are cross-sectional views illustrating a method of manufacturing a thin film transistor array substrate according to an embodiment.

Figure 2A:
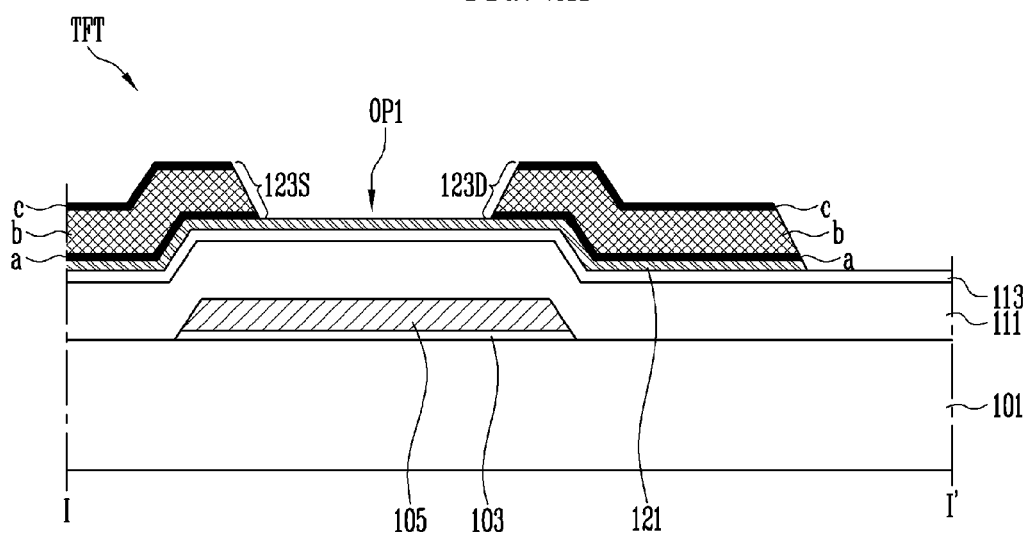
FIGS. 2A to 2G are cross-sectional views illustrating a method of manufacturing a thin film transistor array substrate according to an embodiment.

Referring to FIG. 2A, a thin film transistor TFT may be formed on a substrate 101. The thin film transistor TFT may be formed on the substrate 101 that is covered by a buffer layer 103. In certain circumstances, the buffer layer 103 may be omitted. The thin film transistor TFT may be formed via various processes. Hereinafter, although an example of a process of forming the thin film transistor TFT is provided, the present invention is not limited thereto.

After a gate conductive layer is stacked on the buffer layer 103 or the substrate 101, a gate electrode 105 may be formed by patterning the gate conductive layer using a first masking process. Through the first masking process that patterns the gate electrode 105, a gate line (not shown) may be patterned at the same time as the gate electrode 105.

At least one layer of gate insulating layers 111 and 113 may be formed on the substrate 101 to cover the gate electrode 105. The gate insulating layer may include a first gate insulating layer 111 formed of a silicon nitride layer and a second gate insulating layer 113 formed of a silicon oxide layer.

A semiconductor layer may be formed on the gate insulating layers 111 and 113. The semiconductor layer may be formed of silicon, an oxide semiconductor and the like as described in FIGS. 1A and 1B. A semiconductor pattern 121 may be formed by patterning the semiconductor layer using a second masking process.

A source/drain conductive layer may be formed on the gate insulating layers 111 and 113 and the semiconductor pattern 121. The source/drain conductive layer may have a multilayer structure of a first barrier metal layer a, a metal layer b and a second barrier metal layer c. The metal layer b may be formed of a low resistance metal. For example, but without limitation thereto, the metal layer b may be formed of a copper layer.

A source electrode 123S and a drain electrode 123D facing each other with a first opening OP1 therebetween, the first opening OP1 exposing a portion of the semiconductor pattern 121, may be formed by patterning the source/drain conductive layer using a third masking process. The first opening OP1 may be formed to expose a channel region of the semiconductor pattern 121 overlapping the gate electrode 105.

The thin film transistor TFT including the gate electrode 105, the semiconductor pattern 121, the source electrode 123S and the drain electrode 123D may be formed using the above-described process.

Figure 2B:
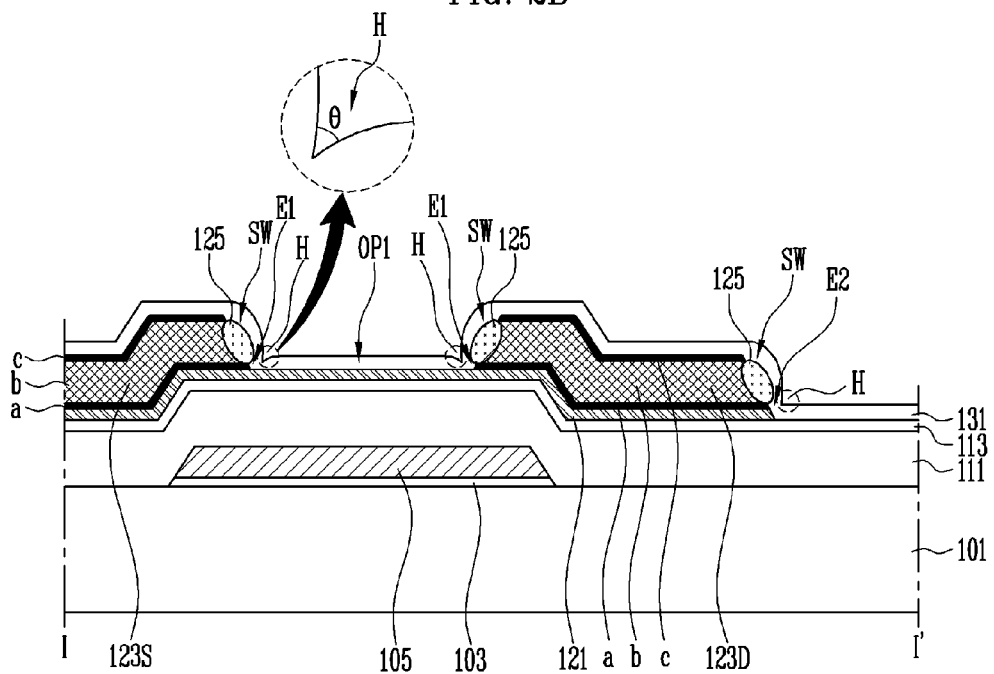

Referring to FIG. 2B, the first protective layer 131 may be formed on the substrate 101 where the thin film transistor TFT is formed. The first protective layer 131 may be formed of a silicon oxide layer. Due to oxygen that is generated in the process of forming the first protective layer 131, the sidewall of the source electrode 123S and the drain electrode 123D may be oxidized. The metal layer b that makes up each of the source electrode 123S and the drain electrode 123D may be vulnerable to oxidation. As a result, the sidewall of the metal layer b may be oxidized and be changed into the oxide region 125 which protrudes convexly. The source electrode 123S and the drain electrode 123D may have a sidewall SW that protrudes convexly due to the oxide region 125. Due to the sidewall SW that protrudes convexly of the source electrode 123S and the drain electrode 123D, the groove H may be formed at a portion of the first protective layer 131. The groove H may be formed along an edge E1 of the first opening OP1, or formed along an edge E2 of the source electrode 123S or the drain electrode 123D adjacent to an edge of the semiconductor pattern 121. The groove H may be formed with an angle θ that is greater than 0° and less than 106°. Also, the angle θ of the groove H may be greater than 106°.

Figure 2C:
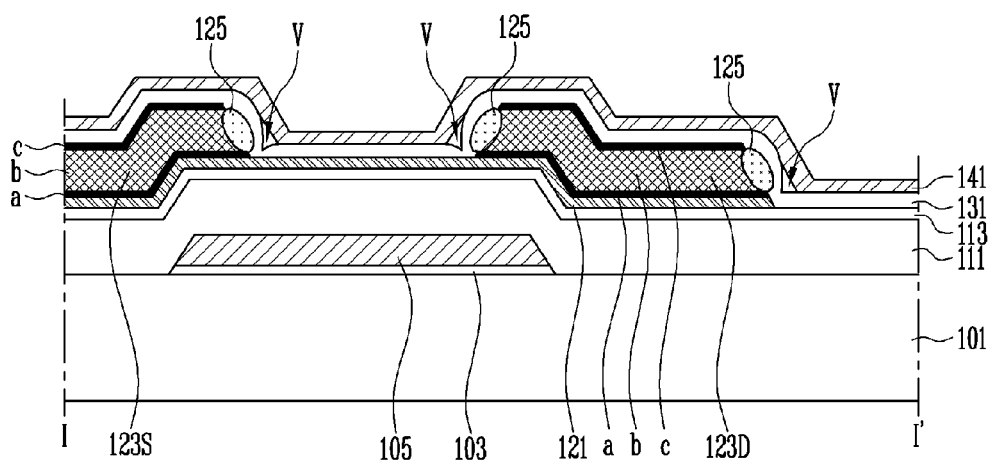

Referring to FIG. 2C, a metal layer 141 may be formed along a surface of the first protective layer 131. If an angle θ of a groove H is greater than 0° and less than 106°, when the metal layer 141 is formed, a void V may occur at the groove H. The metal layer 141 may be formed of aluminum or aluminum alloy having a low melting point.

Figure 2D:
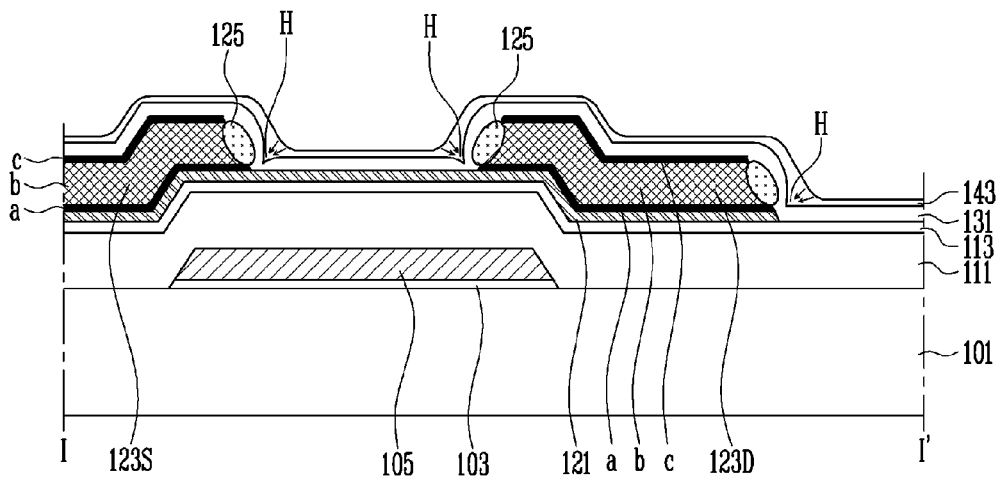

Referring to FIG. 2D, the metal layer (141 in FIG. 2C) may be thermal processed with heat having a temperature higher than the melting point of the metal layer 141. Consequently, the metal layer 141 may have liquidity and fill the groove H. The metal layer 141 may be melted and reflown. Here, the metal layer 141 may be oxidized. As a result, a metal oxide layer 143 that fills the groove H may be formed. The metal layer 141 may be oxidized due to oxygen that is generated in the thermal process. For sufficient oxidation of the metal layer 141, oxygen may be injected in the thermal process for forming the metal oxide layer 143. If the metal layer (141 in FIG. 2C) includes aluminum, the metal layer 143 may be formed of aluminum oxide layer.

Figure 2E:
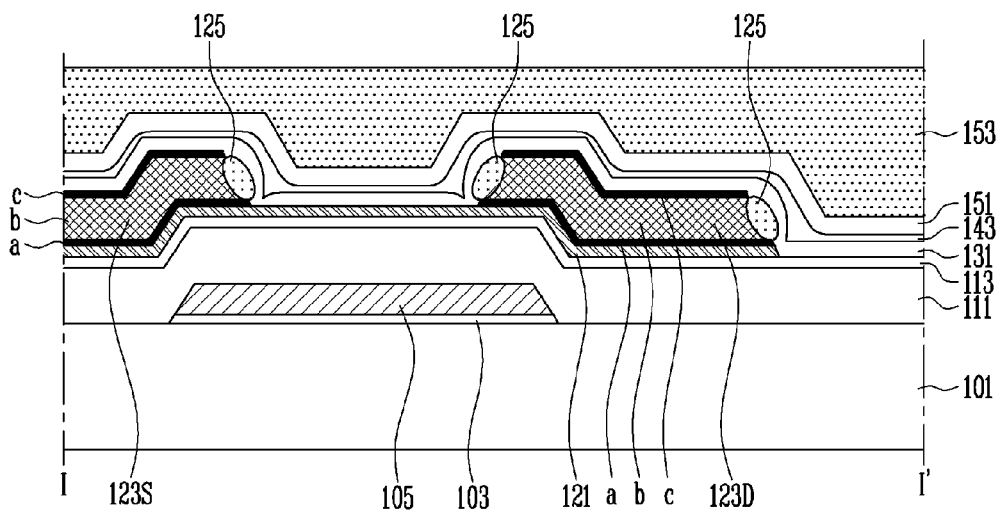

Referring to FIG. 2E, the second protective layer 151 of silicon nitride may be formed on a metal oxide layer 143. The organic layer 153 may then be formed on the second protective layer 151. $H_2$ and $H_2O$ may be present in the organic layer 153.

Figure 2F:
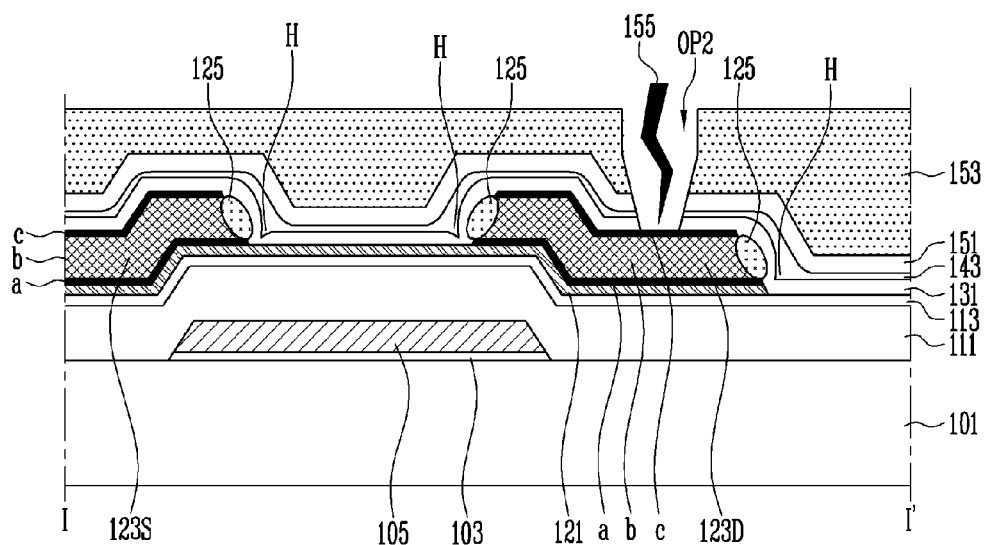

Referring to FIG. 2F, the second opening OP2 which exposes the drain electrode 123D may be formed by etching the organic layer 153, the second protective layer 151, the metal oxide layer 143 and the first protective layer 131. An etching process for forming the second opening OP2 may be a dry etching method using a plasma 155. There may be heat generated at the drain electrode 123D due to the plasma 155.

If a void is formed at groove H and groove H is not filled with the metal oxide layer 143 $H_2$ and $H_2O$ in the organic layer 153 may diffuse to the semiconductor pattern 121 through the void due to the heat transferred via the drain electrode 123D.

In an embodiment, by removing the void by filling the groove H with the metal oxide layer 143, an inflow route of $H_2$ and $H_2O$ from organic layer 153 to the semiconductor pattern 121 may be blocked. As a result, deterioration of the semiconductor pattern 121 may be reduced, and change in the threshold voltage of the thin film transistor TFT due to the deterioration of the semiconductor pattern 121 may be reduced. Consequently, image quality of the display device according to threshold voltage variation of the thin film transistor TFT may be improved.

Figure 2G:
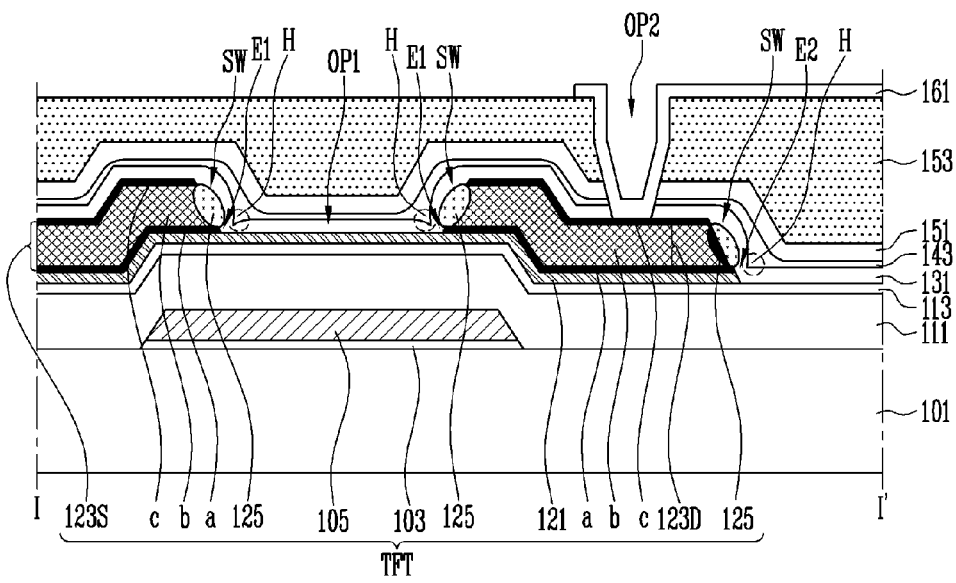

Referring to FIG. 2G, after depositing the pixel conductive layer on the organic layer where the second opening OP2 is formed, the pixel electrode 161 coupled to the drain electrode 123D may be formed by patterning the pixel conductive layer using a fourth masking process. Plasma may be used in a process of depositing the pixel conductive layer. Due to the plasma that is used in the process of depositing the pixel conductive layer, heat may be generated at the drain electrode 123D. As described in FIG. 2F, $H_2$ and $H_2O$ in the organic layer 153 that is diffused by the plasma and the heat that is generated at the time of depositing the pixel conductive layer may be blocked by the metal oxide layer 143 that fills the groove H and may not be diffused to the semiconductor pattern 121. Consequently, the threshold voltage variation of the semiconductor pattern 121 and image quality of the display device arising therefrom may be improved.

By way of summation and review, in an embodiment, a metal oxide layer may be formed on a protective layer that covers a source electrode and a drain electrode. The metal oxide layer may be formed by using a thermal process that includes a process for reflowing a metal layer. As a result, since a groove that is generated at a portion of a protective layer may be filled with the metal oxide layer, a phenomenon in which void and seam occurs in the protective layer may be reduced. Consequently, deterioration in image quality of the display device resulting from the void and the seam in the protective layer may be improved.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:
1. A method for manufacturing a thin film transistor array substrate, the method comprising:
   forming a thin film transistor including a gate electrode, a semiconductor pattern disposed on the gate electrode with a gate insulating layer therebetween and a source electrode and a drain electrode disposed on the semi- conductor pattern and facing each other with a first opening exposing a portion of the semiconductor pattern therebetween;

forming a first protective layer covering the thin film transistor, wherein during the forming of the first protective layer, a groove is formed along an edge of the first opening;

forming a metal layer along a surface of the first protective layer including the groove; and performing thermal processing such that the metal layer is oxidized while being reflown and filling the groove.

2. The method of claim 1, wherein during the performing of the thermal processing, oxygen is injected.

3. The method of claim 1, wherein the metal layer includes aluminum.

4. The method of claim 1, wherein the forming of the first protective layer includes forming a silicon oxide layer.

5. The method of claim 1, wherein the source electrode and the drain electrode include copper.

6. The method of claim 5, wherein the thermal processing being conducted at a temperature higher than the melting point of aluminum.

7. The method of claim 1, wherein the forming of the metal oxide layer includes forming an aluminum oxide layer.

8. The method of claim 1, further comprising:
forming a second protective layer on the metal oxide layer;
forming an organic layer on the second protective layer;
forming a second opening exposing the drain electrode by etching the organic layer, the second protective layer, the metal oxide layer and the first protective layer; and
forming a pixel electrode coupled to the drain electrode via the second opening on the organic layer.

9. The method of claim 8, wherein the forming of the second opening being achieved by a dry etching technique using a plasma, wherein the reflowing of the metal layer to fill the groove to prevent $H_2O$ and $H_2$ from diffusing from the organic layer to the semiconductor pattern during the formation of the second opening.

10. The method of claim 1, wherein the groove has an angle between adjacent contacting inner sides of the groove being greater than 0° and less than 106°.

11. The method of claim 1, each of the source and drain electrodes being comprised of a metallic material, wherein the thermal processing being conducted at a temperature higher than a melting point of the metal layer.

12. The method of claim 1, the first protective layer being comprised of a silicon oxide layer and the source and drain electrodes being comprised of a metal layer, wherein oxygen generated during the formation of the first protective layer oxidizes sidewalls of the source and drain electrodes to produce convexly protruding metal oxide regions at sidewalls of the source and drain electrodes, the groove in the first protective layer being formed due to the convexly protruding sidewalls of the source and drain electrodes.

13. A thin film transistor array substrate, comprising:
a gate electrode;
a gate insulating layer covering the gate electrode;
a semiconductor pattern formed on the gate insulating layer and including a channel region overlapping the gate electrode;
a source electrode and a drain electrode formed on the semiconductor pattern and facing each other with a first opening exposing the channel region therebetween;
a first protective layer formed on the gate insulating layer to cover the source electrode, the drain electrode and the semiconductor pattern, wherein the first protective layer includes a silicon oxide layer, wherein the first protective layer includes a groove formed along an edge of the first opening, wherein the groove has an angle between adjacent contacting inner sides of the groove being greater than 0° and less than 106°; and
a metal oxide layer formed along a surface of the first protective layer, wherein each of the source and drain electrodes comprise a metal oxide region convexly protruding from sidewalls of the source and drain electrodes.

14. The thin film transistor array substrate of claim 13, wherein the metal oxide layer is formed to fill the groove.

15. The thin film transistor array substrate of claim 13, wherein the source electrode and the drain electrode include copper.

16. The thin film transistor array substrate of claim 13, wherein the metal oxide layer includes an aluminum oxide layer.

17. The thin film transistor array substrate of claim 13, further comprising:
a second protective layer formed on the metal oxide layer, the second protective layer includes a silicon nitride layer;
an organic layer formed on the second protective layer;
a second opening exposing the drain electrode by passing through the organic layer, the second protective layer, the metal oxide layer and the first protective layer; and
a pixel electrode formed on the organic layer to contact the drain electrode via the second opening.

18. The thin film transistor array of claim 13, wherein the groove in the first protective layer being formed due to the convexly protruding sidewalls of the source and drain electrodes.

* * * * *